(12) United States Patent
Lin et al.

(10) Patent No.: US 12,376,337 B2
(45) Date of Patent: Jul. 29, 2025

(54) AIR INNER SPACERS

(71) Applicant: Taiwan Semiconductor Manufacturing Company, Ltd., Hsinchu (TW)

(72) Inventors: Fo-Ju Lin, Keelung (TW); Fang-Wei Lee, Hsinchu (TW); Chih-Long Chiang, Hsinchu (TW); Li-Te Lin, Hsinchu (TW); Pinyen Lin, Rochester, NY (US)

(73) Assignee: Taiwan Semiconductor Manufacturing Company, Ltd.

( * ) Notice: Subject to any disclaimer, the term of this patent is extended or adjusted under 35 U.S.C. 154(b) by 732 days.

(21) Appl. No.: 17/471,859

(22) Filed: Sep. 10, 2021

(65) Prior Publication Data

US 2022/0336611 A1 Oct. 20, 2022

Related U.S. Application Data

(60) Provisional application No. 63/163,544, filed on Mar. 19, 2021.

(51) Int. Cl.
| | |
|---|---|
| *H10D 30/67* | (2025.01) |
| *H01L 21/311* | (2006.01) |
| *H10D 62/10* | (2025.01) |
| *H10D 64/01* | (2025.01) |
| *H10D 64/23* | (2025.01) |

(52) U.S. Cl.
CPC .... *H10D 30/6735* (2025.01); *H01L 21/31116* (2013.01); *H10D 30/6757* (2025.01); *H10D 62/118* (2025.01); *H10D 64/01* (2025.01); *H10D 64/018* (2025.01); *H10D 64/258* (2025.01)

(58) Field of Classification Search
None
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |

(Continued)

*Primary Examiner* — Jack S Chen

(74) *Attorney, Agent, or Firm* — Sterne, Kessler, Goldstein & Fox P.L.L.C.

(57) ABSTRACT

The present disclosure describes a method to form a semiconductor device with air inner spacers. The method includes forming a semiconductor structure on a first side of a substrate. The semiconductor structure includes a fin structure having multiple semiconductor layers on the substrate, an epitaxial structure on the substrate and in contact with the multiple semiconductor layers, a gate structure wrapped around the multiple semiconductor layers, and an inner spacer structure between the gate structure and the epitaxial structure. The method further includes removing a portion of the substrate from a second side of the substrate to expose the epitaxial structure and the inner spacer structure, forming an oxide layer on the epitaxial structure on the second side of the substrate, and removing a portion of the inner spacer structure to form an opening. The second side is opposite to the first side of the substrate.

20 Claims, 12 Drawing Sheets

(56) References Cited

U.S. PATENT DOCUMENTS

| | | |
|---|---|---|
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2022/0336611 A1* | 10/2022 | Lin ..................... H01L 21/306 |

* cited by examiner

AIR INNER SPACERS

CROSS-REFERENCE TO RELATED APPLICATIONS

This application claims the benefit of U.S. Provisional Patent Application No. 63/163,544, titled "Etching Process Application on Air Inner Spacer Formation," filed Mar. 19, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
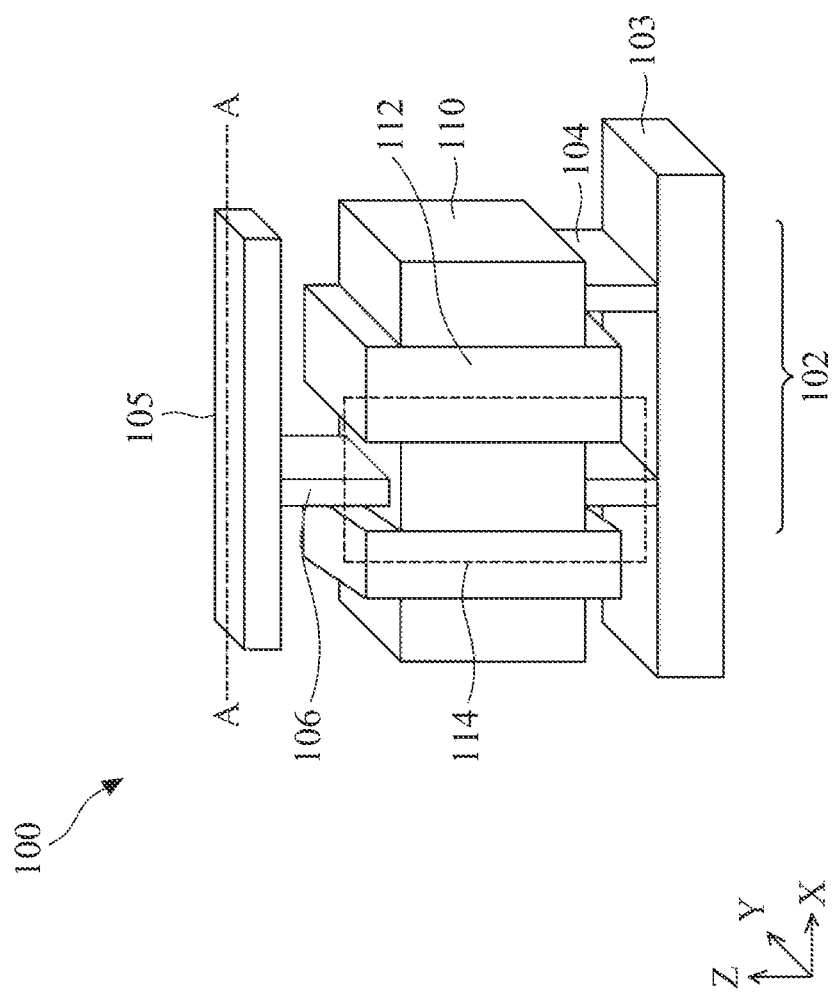
FIGS. 1 and 2 illustrate an isometric view and a partial cross-sectional view of a semiconductor device with air inner spacers, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, increase on-state current to off-state current ratio (Ion/Ioff), and reduce short-channel effects (SCEs). One such multi-gate device is the gate-all-around fin field effect transistor (GAA finFET). The GAA finFET device provides a channel in a stacked nanosheet/nanowire configuration, for which the GAA finFET device can also be referred to as "a nanosheet device." The GAA finFET device derives its name from the gate structure that can extend around the channel and provide gate control of the channel on multiple sides of the channel. GAA finFET devices are compatible with MOSFET manufacturing processes and their structure allows them to be scaled while maintaining gate control and mitigating SCEs.

With increasing demand for lower power consumption, higher performance, and smaller area (collectively referred to as "PPA") of semiconductor devices, the GAA finFET devices can have backside contact structures and backside power rails to reduce the device area and the metal interconnect length, thus reducing parasitic capacitances and parasitic resistances and improving device performance. GAA finFET devices can have front-side source/drain (S/D) contact structures at the front-side and backside S/D contact structures at the backside to reduce device area, parasitic capacitance and resistance, and improve device performance. Front-side contact structures can connect S/D epitaxial structures of a GAA finFET device to front-side power rails. Backside contact structures can connect the S/D epitaxial structures of the GAA finFET device to backside power rails. In the GAA finFET device, the S/D epitaxial structures, the inner spacer structures, and the gate structures can form parasitic capacitors that can degrade device performance of the GAA finFET device. The inner spacer structures between the gate structures and the S/D region may not be removed from the front side to form an air gap due to the blockage of the gate structures and smaller dimensions of the inner spacer structures. In addition, the inner spacer structures may have a lower etching selectivity compared to adjacent structures and the adjacent structures may be damaged during the removal of the inner spacer structures.

Various embodiments in the present disclosure provide methods for forming a semiconductor device with air inner spacers. In some embodiments, the semiconductor device can be a GAA finFET device having, for example, backside contact structures and backside power rails. According to some embodiments, the air inner spacers can be formed by removing a portion of an inner spacer structure between an S/D epitaxial structure and a gate structure of the semiconductor device. The inner spacer structure, the S/D epitaxial structure, and the gate structure can be formed on a front side of a substrate. The inner spacer structure can include a first spacer layer and a second spacer layer and the second spacer layer can have a higher etch selectivity than the first spacer layer. The semiconductor device can be bonded to a carrier wafer and the substrate can be removed from a backside of the substrate to expose the S/D epitaxial structure and the inner spacer structure. The second spacer layer can be removed from the backside to form an opening. A dielectric layer can be formed on the S/D epitaxial structure to seal the opening and form the air inner spacers. Compared to other dielectric materials, the air inner spacers can have a lower dielectric constant or k value of about 1. Accordingly, the parasitic capacitance between the gate structure and the S/D epitaxial structure can be reduced and the device performance of the semiconductor device can be improved. In some embodiments, the parasitic capacitance between the gate structure and the S/D epitaxial structure can be reduced by about 5% to about 10% and device performance can be improved by about 5% to about 10%.

Figure 2:
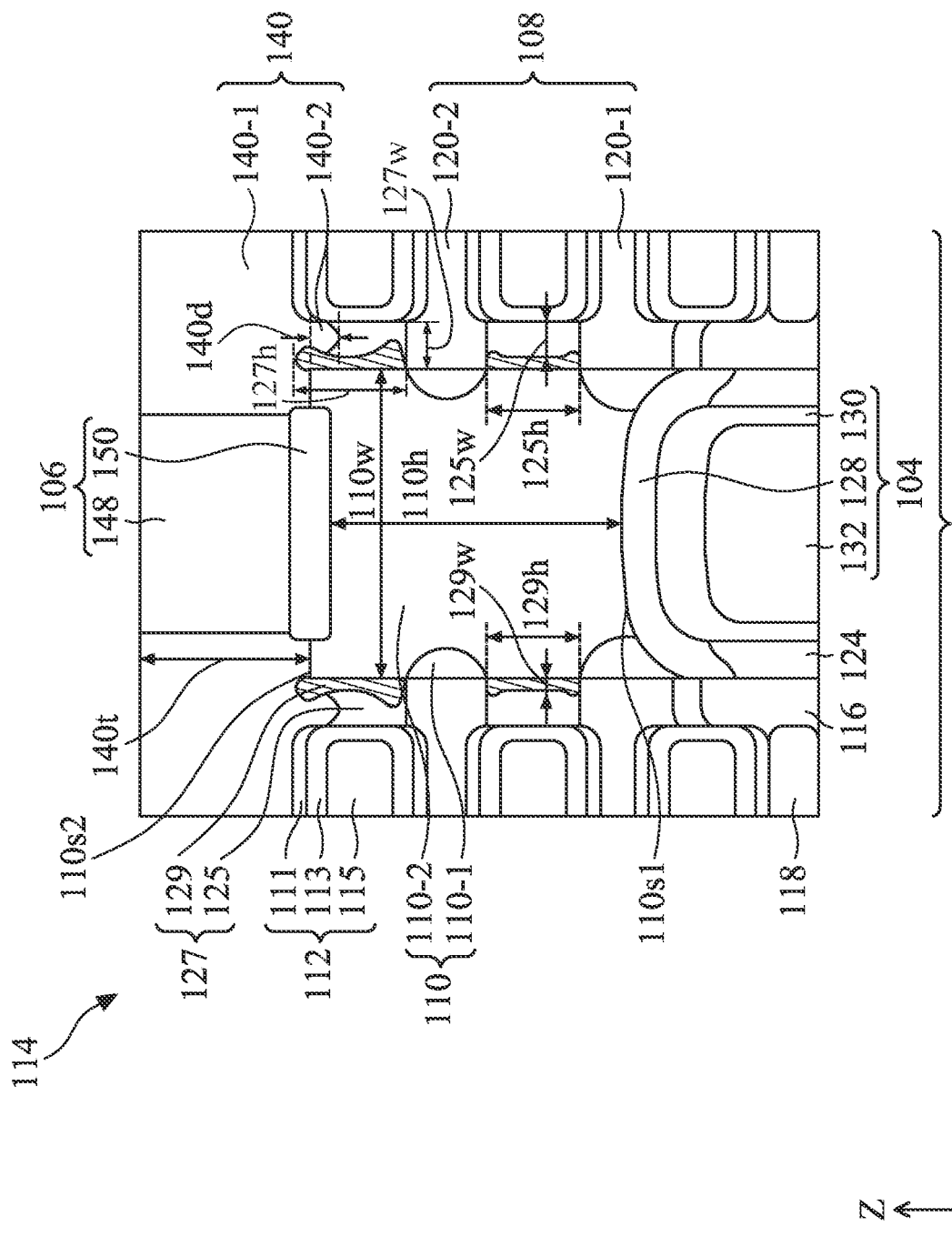

FIG. 1 illustrates an isometric view of a semiconductor device 100 with air inner spacers, in accordance with some embodiments. FIG. 2 illustrates a partial cross-sectional view of region 114 of semiconductor device 100 along line A-A in FIG. 1, in accordance with some embodiments. Semiconductor device 100 can include a FET 102. First contact structures 104 (also referred to as "front-side contact structures 104") can connect S/D epitaxial structures 110 of FET 102 to front-side power rails 103. Second contact structures 106 (also referred to as "backside contact structures 106") can connect S/D epitaxial structures 110 of FET 102 to backside power rails 105. FET 102 can further include fin structures 108, S/D epitaxial structures 110, gate structures 112, gate spacers 116, inner spacer structures 127, an etch stop layer (ESL) 124, and a dielectric layer 140. In some embodiments, FIGS. 1 and 2 show a portion of semiconductor device 100 where the fin structures and the gate structures can be similar or different from the one shown in FIGS. 1 and 2.

In some embodiments, FET 102 can be a p-type finFET (PFET) or an n-type finFET (NFET). The term "p-type" can be associated with a structure, layer, and/or region doped with p-type dopants, such as boron. The term "n-type" can be associated with a structure, layer, and/or region doped with n-type dopants, such as phosphorus. Though FIGS. 1 and 2 show one finFET, semiconductor device 100 can have any number of finFETs. In addition, semiconductor device 100 can be incorporated into an integrated circuit through the use of other structural components, such as conductive vias, conductive lines, dielectric layers, and passivation layers, which are not shown for simplicity.

Figure 4:
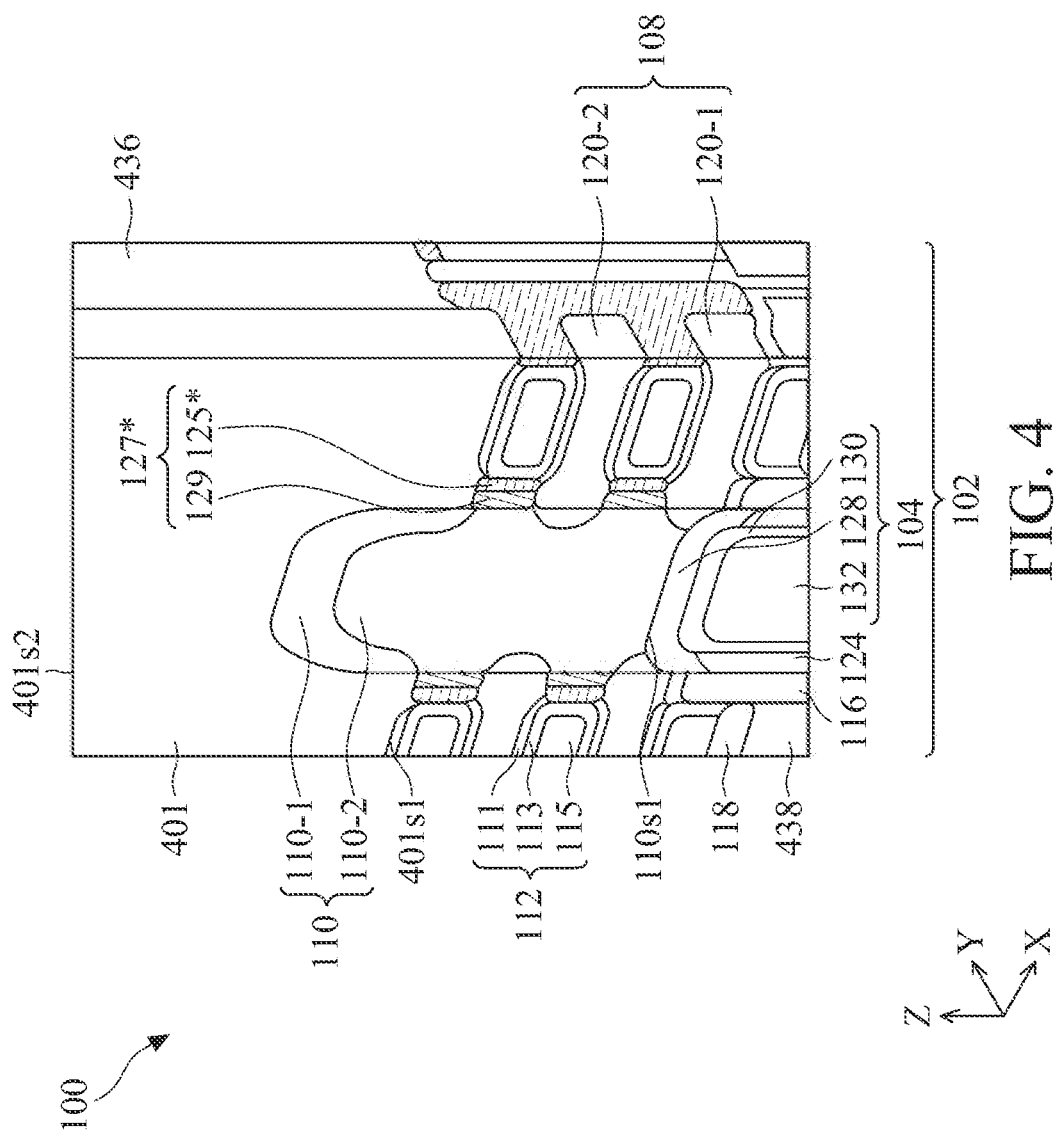
FIGS. 4-12 illustrate isometric views and cross-sectional views of a semiconductor device with air inner spacers at various stages of its fabrication process, in accordance with some embodiments.

FET 102 can be formed on a substrate. FIG. 4 can illustrate the formation of FET 102 in FIG. 1 on a first side 401s1 (e.g., front side) of substrate 401. In some embodiments, substrate 401 can include a semiconductor material, such as silicon. In some embodiments, substrate 401 can include a crystalline silicon substrate (e.g., wafer). In some embodiments, substrate 401 includes (i) an elementary semiconductor, such as germanium (Ge); (ii) a compound semiconductor including silicon carbide, gallium arsenide, gallium phosphide, indium phosphide, indium arsenide, and/or indium antimonide; (iii) an alloy semiconductor including silicon germanium (SiGe), silicon germanium carbide, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 401 can be doped depending on design requirements (e.g., p-type substrate or n-type substrate). In some embodiments, substrate 401 can be doped with p-type dopants (e.g., boron, indium, aluminum, or gallium) or n-type dopants (e.g., phosphorus or arsenic).

As shown in FIG. 2, semiconductor device 100 can include fin structures 108 extending along an X-axis. Fin structures 108 can include a stack of semiconductor layers 120-1 and 120-2 (collectively referred to as "semiconductor layers 120"), which can be nanosheets or nanowires. Each of semiconductor layers 120 can form a channel region underlying gate structures 112 of FET 102. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

In some embodiments, semiconductor layers 120 can include semiconductor materials similar to or different from substrate 401. In some embodiments, each of semiconductor layers 120 can include silicon without any substantial amount of germanium or can include SiGe with germanium in a range from about 5 atomic percent to about 50 atomic percent with any remaining atomic percent being silicon. The semiconductor materials of semiconductor layers 120 can be undoped or can be in-situ doped during its epitaxial growth process using: (i) p-type dopants, such as boron, indium, and gallium; and/or (ii) n-type dopants, such as phosphorus and arsenic. Though two layers of semiconductor layers 120 for FET 102 are shown in FIG. 2, FET 102 can have any number of semiconductor layers 120.

Referring to FIGS. 1 and 2, S/D epitaxial structures 110 can be disposed between adjacent fin structures 108 and gate structures 112. In some embodiments, S/D epitaxial structures 110 can have a first side (e.g., front side) 110s1 and a second side 110s2 (e.g., backside) opposite to first side (e.g., front side) 110s1, as shown in FIG. 2. In some embodiments, S/D epitaxial structures 110 can have any geometric shape, such as a polygon, an ellipsis, and a circle. S/D epitaxial structures 110 can include an epitaxially-grown semiconductor material. In some embodiments, the epitaxially-grown semiconductor material can be the same material as substrate 401. In some embodiments, the epitaxially-grown semiconductor material can include a different material from substrate 401. In some embodiments, the epitaxially-grown semiconductor material for S/D epitaxial structures 110 can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as SiGe and gallium arsenide phosphide. In some embodiments, the epitaxially-grown semiconductor material can include SiGe with germanium in a range from about 10 atomic percent to about 90 atomic percent with any remaining atomic percentage being silicon.

In some embodiments, S/D epitaxial structures 110 can be n-type or p-type. In some embodiments, n-type S/D epitaxial structures 110 can include silicon and can be in-situ doped during an epitaxial growth process using n-type dopants, such as phosphorus and arsenic. In some embodiments, n-type S/D epitaxial structures 110 can have multiple n-type epitaxial fin sub-regions that can differ from each other based on, for example, doping concentration and/or epitaxial growth process conditions. In some embodiments, p-type S/D epitaxial structures 110 can include SiGe and can be in-situ doped during an epitaxial growth process using p-type dopants, such as boron, indium, and gallium. In some embodiments, p-type S/D epitaxial structures 110 can have multiple sub-regions that can include SiGe and can differ from each other based on, for example, doping concentration, epitaxial growth process conditions, and/or relative concentration of germanium with respect to silicon. For example, as shown in FIG. 2, S/D epitaxial structures 110 can include first S/D epitaxial sub-structures 110-1 and second S/D epitaxial sub-structures 110-2. In some embodiments, S/D epitaxial structures 110 can have a horizontal dimension 110$w$ (e.g., width) along an X-axis ranging from about 15 nm to about 25 nm. S/D epitaxial sub-structures 110 can have a vertical dimension 110$h$ (e.g., height) along a Z-axis ranging from about 40 nm to about 60 nm.

In some embodiments, fin structures 108 can be current-carrying structures for FET 102. Channel regions of FET 102 can be formed in portions of their respective fin structures 108 underlying gate structures 112. S/D epitaxial structures 110 can function as source/drain regions of FET 102.

Referring to FIGS. 1 and 2, gate structures 112 can be multi-layered structures and can be wrapped around semiconductor layers 120 of fin structures 108. In some embodiments, each of semiconductor layers 120 of fin structures 108 can be wrapped around by one or more layers of gate structures 112, and gate structures 112 can be referred to as "gate-all-around (GAA) structures" and FET 102 can be referred to as "GAA FET" or "GAA finFET."

Gate structures 112 can include an interfacial layer 111, a gate dielectric layer 113, and a gate electrode 115 wrapped around semiconductor layers 120. Interfacial layer 111 and gate dielectric layer 113 can be wrapped around each of semiconductor layers 120, and thus electrically isolate semiconductor layers 120 from each other and from the conductive gate electrode to prevent shorting between gate structures 112 and semiconductor layers 120 during operation of FET 102. In some embodiments, interfacial layer 111 can include silicon oxide ($SiO_x$). In some embodiments, gate dielectric layer 113 can include a high-k dielectric material. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, the high-k dielectric material can include hafnium oxide ($HfO_2$), zirconium oxide ($ZrO_2$), or any suitable dielectric material. In some embodiments, the gate electrode can include a gate barrier layer, a gate work function layer, and a gate metal fill layer (not shown). In some embodiments, the gate electrode can include titanium (Ti), tantalum (Ta), titanium nitride (TiN), tantalum nitride (TaN), aluminum (Al), copper (Cu), tungsten (W), cobalt (Co), or other suitable conductive materials.

Gate spacers 116 can be disposed along sidewalls of gate structures 112. Gate spacers 116 can include a dielectric material, such as $SiO_x$, silicon oxynitride (SiON), silicon nitride ($SiN_x$), silicon oxycarbide (SiOC), silicon carbonitride (SiCN), silicon oxynitricarbide (SiOCN), and a combination thereof. In some embodiments, gate spacers 116 can include a single layer or multiple layers of insulating materials. In some embodiments, gate spacers 116 can isolate gate structures 112 and adjacent front-side contact structures 104.

Referring to FIG. 2, inner spacer structures 127 can be disposed between portions of gate structures 112 and S/D epitaxial structures 110. Inner spacer structures 127 can include materials to isolate gate structures 112 and S/D epitaxial structures 110. In some embodiments, inner spacer structures 127 can include air inner spacers 125 and first spacer layers 129. In some embodiments, inner spacer structures 127 can have a horizontal dimension 127$w$ (e.g., width) along an X-axis ranging from about 5 nm to about 10 nm. In some embodiments, inner spacer structures 127 between semiconductor layers 120 can have a vertical dimension 127$h$ (e.g., height) along a Z-axis ranging from about 5 nm to about 15 nm.

Air inner spacers 125 can be disposed between first spacer layers 129 and gate structures 112, as shown in FIG. 2. In some embodiments, air inner spacers 125 can be filled with air and can have a dielectric constant of about 1 to reduce the dielectric constant and parasitic capacitance between gate structures 112 and S/D epitaxial structures 110. Air inner spacers 125 can be formed from second side 110$s2$ (e.g., backside) of S/D epitaxial structures 110.

In some embodiments, air inner spacers 125 can have a horizontal dimension 125$w$ (e.g., width) along an X-axis ranging from about 3 nm to about 5 nm. A ratio of horizontal dimension 125$w$ of air inner spacers 125 to horizontal dimension 127$w$ of inner spacer structures 127 can range from about 0.3 to about 0.9. If horizontal dimension 125$w$ is less than about 3 nm or the ratio is less than about 0.3, air inner spacers 125 may have a smaller volume and may not reduce the parasitic capacitance between gate structures 112 and S/D epitaxial structures 110. If horizontal dimension 125$w$ is greater than about 5 nm or the ratio is greater than about 0.9, S/D epitaxial structures 110 may be damaged and device performance of semiconductor device 100 may be degraded.

In some embodiments, air inner spacers 125 between semiconductor layers 120 can have a vertical dimension 125$h$ (e.g., height) along a Z-axis ranging from about 5 nm to about 15 nm. In some embodiments, air inner spacers 125 can surround semiconductor layers 120 and can be connected to each other. Connected air inner spacers 125 can have a height similar to vertical dimension 110$h$ of S/D epitaxial structures 110.

In some embodiments, first spacer layers 129 can be in contact with S/D epitaxial structures 110 and can protect S/D epitaxial structures 110 during the formation of air inner spacers 125. In some embodiments, first spacer layers 129 can include a dielectric material, such as $SiO_x$, SiON, $SiN_x$, SiOC, SiCN, and SiOCN. In some embodiments, first spacer layers 129 can include SiOCN and have silicon from about 25% to about 35%, oxygen from about 35% to about 45%, carbon from about 1% to about 10%, and nitrogen from about 15% to about 25%. In some embodiments, first spacer layers 129 can have a dielectric constant from about 3 to about 5. In some embodiments, first spacer layers 129 can have a horizontal dimension 129w (e.g., width) along an X-axis ranging from about 3 nm to about 5 nm. In some embodiments, first spacer layers 129 between semiconductor layers 120 can have a vertical dimension 129h (e.g., height) along a Z-axis ranging from about 5 nm to about 15 nm.

Referring to FIG. 2, ESL 124 can be disposed on first side 110s1 of S/D epitaxial structures 110. ESL 124 can protect portions of S/D epitaxial structures 110 that are not in contact with front-side contact structures 104. This protection can be provided, for example, during the formation of front-side contact structures 104. In some embodiments, ESL 124 can include, for example, $SiO_x$, SiON, $SiN_x$, SiOC, SiCN, SiOCN, or a combination thereof.

In some embodiments, front-side contact structures 104 can be disposed on first side 110s1 of S/D epitaxial structures 110 and can electrically connect S/D epitaxial structures 110 of FET 102 to front-side power rails 103 and other elements of semiconductor device 100 and/or of the integrated circuit. In some embodiments, front-side power rails 103 can include power supply lines or ground lines for semiconductor device 100. In some embodiments, front-side contact structures 104 can be dummy S/D contact structures and may not be connected to front-side power rails 103. Front-side contact structures 104 can be formed within ESL 124. According to some embodiments, front-side contact structures 104 can include metal silicide layers 128, metal liners 130, and conductive regions 132. In some embodiments, metal silicide layers 128 can include metal silicide and can provide a lower resistance interface between conductive regions 132 and S/D epitaxial structures 110. Examples of metal used for forming the metal silicide include Co, Ti, and nickel (Ni). Metal liners 130 can be configured as diffusion barriers to prevent oxidation of metal silicide layers 128 and diffusion of other unwanted atoms and/or ions into metal silicide layers 128 during formation of conductive regions 132. In some embodiments, metal liners 130 can act as an adhesion-promoting layer, a glue layer, a primer layer, a protective layer, and/or a nucleation layer. In some embodiments, metal liners 130 can include a single layer or a stack of conductive materials, such as Ti, Ni, TiN, Ta, and TaN. In some embodiments, conductive regions 132 can include conductive materials, such as W, Al, and Co.

Referring to FIG. 2, dielectric layer 140 can be disposed on second side 110s2 of S/D epitaxial structures 110, inner spacer structures 127, and gate structures 112. Dielectric layer 140 can include a dielectric material, such as $SiO_x$, SiON, $SiN_x$, SiOC, SiCN, and SiOCN. In some embodiments, dielectric layer 140 can have a vertical dimension 140t (e.g., thickness) along a Z-axis ranging from about 20 nm to about 30 nm. Dielectric layer 140 can seal air inner spacers 125 and protect adjacent structures during the formation of backside contact structures 106. In some embodiments, dielectric layer 140 can include a first portion 140-1 on S/D epitaxial structures 110 and gate structures 112, as shown in FIG. 2. Dielectric layer 140 can also include a second portion 140-2 extending into air inner spacers 125, as shown in FIG. 2. First portion 140-1 can be at a different level from second portion 140-2. In some embodiments, a distance 140d along a Z-axis of second portion 140-2 extending into air inner spacers 125 relative to second side 110s2 can range from about 0.1 nm to about 2 nm. If distance 140d is less than about 0.1 nm, dielectric layer 140 may not be formed on second side 110s2. If distance 140d is greater than about 2 nm, air inner spacers 125 may have a smaller volume and the parasitic capacitance between gate structures 112 and S/D epitaxial structures 110 may increase.

Backside contact structures 106 can be disposed on second side 110s2 of S/D epitaxial structures 110 and can electrically connect S/D epitaxial structures 110 to backside power rails 105 and other elements of semiconductor device 100 and/or of the integrated circuit. In some embodiments, backside power rails 105 can include power supply lines or ground lines for semiconductor device 100. Backside contact structures 106 can be formed within dielectric layer 140. According to some embodiments, backside contact structures 106 can include metal silicide layers 150 and metal line 148. In some embodiments, metal silicide layers 150 can include metal silicide similar to metal silicide layers 128 and can provide a lower resistance interface than metal line 148 between metal line 148 and S/D epitaxial structures 110. In some embodiments, metal line 148 can include conductive materials similar to conductive regions 132.

Referring to FIG. 2, semiconductor device 100 can further include gate contact structures 118. Gate contact structures 118 can electrically connect gate structures 112 to other elements of semiconductor device 100 and/or of the integrated circuit. In some embodiments, gate contact structures 118 can include conductive materials similar to front-side contact structures 104. In some embodiments, semiconductor device 100 can further include other structures, such as metal lines, metal vias, and dielectric structures, to provide connection to and isolation from other portions of semiconductor device 100. These structures are not shown in detail merely for clarity and ease of description.

Figure 3:
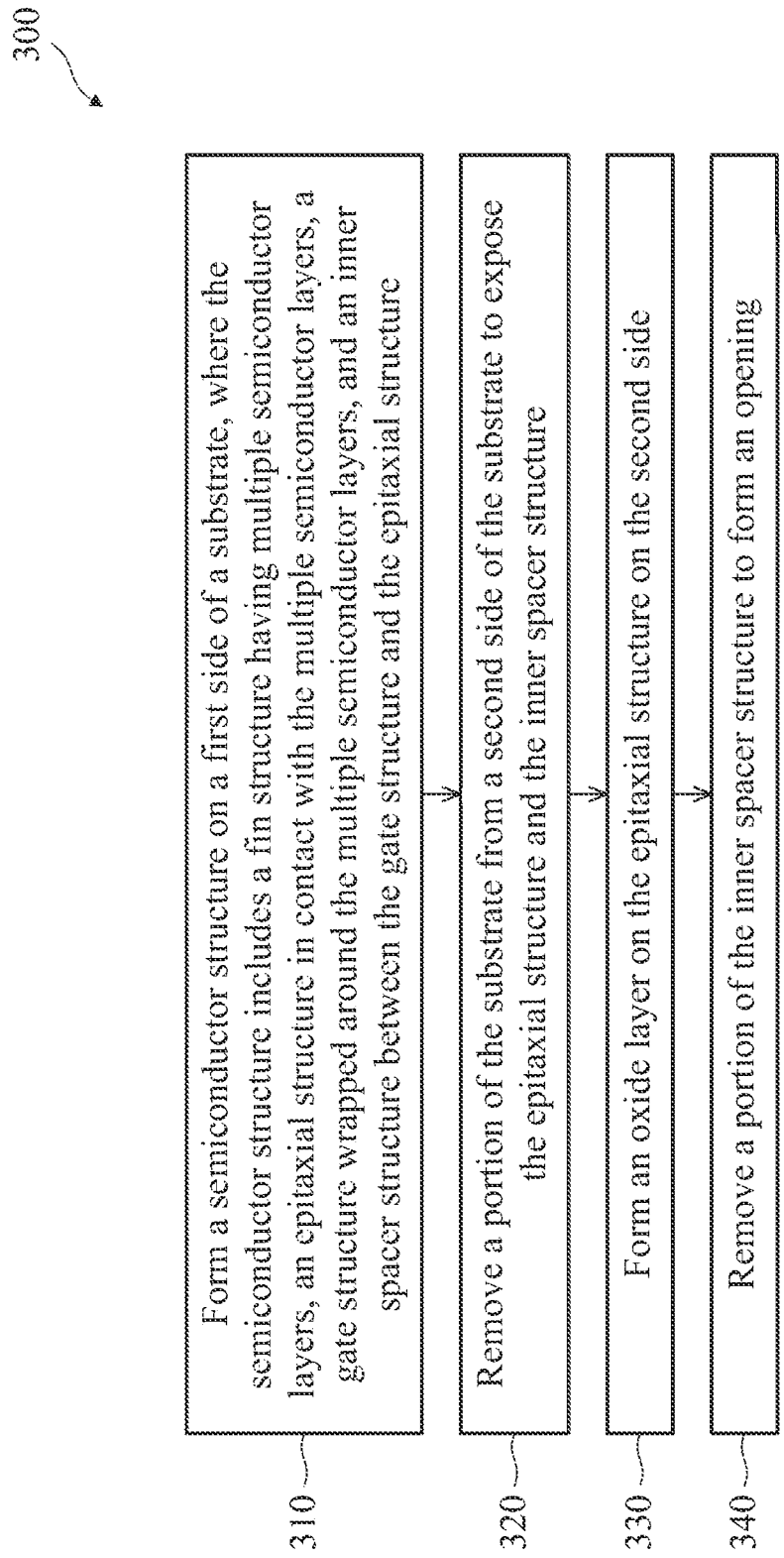
FIG. 3 is a flow diagram of a method for fabricating a semiconductor device with air inner spacers, in accordance with some embodiments.

FIG. 3 is a flow diagram of a method 300 for fabricating semiconductor device 100 with air inner spacers 125, in accordance with some embodiments. Method 300 may not be limited to GAA finFET devices and can be applicable to devices that would benefit from air inner spacers, such as planar FETs, finFETs, GAA FETs, and other semiconductor devices. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for fabricating semiconductor device 100 as illustrated in FIGS. 4-12. FIGS. 4-12 illustrate isometric and cross-sectional views of semiconductor device 100 with air inner spacers 125 at various stages of its fabrication, in accordance with some embodiments. Elements in FIGS. 4-12 with the same annotations as elements in FIGS. 1 and 2 are described above.

In referring to FIG. 3, method 300 begins with operation 310 of forming a semiconductor structure on a first side of a substrate. The semiconductor structure includes a fin structure having multiple semiconductor layers on the substrate, an epitaxial structure on the substrate and in contact with the multiple semiconductor layers, a gate structure wrapped around the multiple semiconductor layers, and an inner spacer structure between the gate structure and the epitaxial structure. For example, as shown in FIG. 4, FET 102 of semiconductor device 100 can be formed on first side 401$s$1 (e.g., front side) of substrate 401. FET 102 can include fin structures 108, S/D epitaxial structures 110, gate structures 112, and inner spacer structures 127*. Fin structures 108 can include semiconductor layers 120 and can be formed on substrate 401. The formation of fin structures 108 can include epitaxially growing semiconductor layers having different etch selectivity in an alternating configuration and replacing a portion of the semiconductor layers with gate structures 112. In some embodiments, semiconductor layers 120 can include silicon. In some embodiments, semiconductor layers 120 can include SiGe. Gate structures 112 can wrap around each of semiconductor layers 120. Gate spacers 116 can be formed on sidewalls of gate structures 112 over fin structures 108. Gate contact structures 118 can be formed on gate structures 112. Interlayer dielectric (ILD) layer 438 can be formed on gate contact structures 118 to isolate gate contact structures 118 from adjacent structures.

Inner spacer structures 127* can be formed adjacent to gate structures 112 and between semiconductor layers 120. In some embodiments, inner spacer structures 127* can include first spacer layers 129 in contact with S/D epitaxial structures 110 and second spacer layers 125* in contact with gate structures 112. In some embodiments, first and second spacer layers 129 and 125* can include dielectric materials, such as $SiO_x$, SiON, $SiN_x$, SiOC, SiCN, and SiOCN. In some embodiments, first spacer layers 129 can have an oxygen concentration higher than second spacer layers 125* to increase etch selectivity. In some embodiments, first spacer layers 129 can include SiOCN and have silicon from about 25% to about 35%, oxygen from about 35% to about 45%, carbon from about 1% to about 10%, and nitrogen from about 15% to about 25%. In some embodiments, second spacer layers 125* can include SiCN and have silicon from about 45% to about 55%, oxygen from about 1% to about 10%, carbon from about 10% to about 20%, and nitrogen from about 25% to about 35%.

In some embodiments, a difference of oxygen percentages between first spacer layers 129 and second spacer layers 125* can range from about 20% to about 50% and an etch selectivity between second spacer layers 125* and first spacer layers 129 can range from about 3 to about 5. If the difference is less than about 20% or the etch selectivity is less than about 3, first spacer layers 129 may not protect S/D epitaxial structures 110. If the difference is greater than about 50% or the etch selectivity is greater than about 5, first spacer layers 129 may not be over etched during the removal of second spacer layers 125* and the volume of subsequently-formed air inner spacers 125 may be reduced.

In some embodiments, first spacer layers 129 can have a dielectric constant from about 3.9 to about 10. If the dielectric constant is less than about 3.9, the oxygen percentage difference and the etch selectivity between second spacer layers 125* and first spacer layers 129 may be reduced. Further, first spacer layers 129 may not protect S/D epitaxial structure 110. If the dielectric constant is greater than about 10, the remaining second spacers 125* may increase the parasitic capacitance between gate structures 112 and S/D epitaxial structures 110.

As shown in FIG. 4, S/D epitaxial structures 110 can be formed between adjacent fin structures 108 and gate structures 112. In some embodiments, S/D epitaxial structures 110 can be epitaxially grown on substrate 401 and semiconductor layers 120. In some embodiments, S/D epitaxial structures 110 can include first S/D epitaxial sub-structures 110-1 and second S/D epitaxial sub-structures 110-2. ESL 124 can be formed on first side 110$s$1 (e.g., front side) of S/D epitaxial structures 110. Front-side contact structure 104 can be formed in ESL 124 and in contact with S/D epitaxial structures 110.

FET 102 can further include shallow trench isolation (STI) 436 to isolate FET 102 from adjacent structures. In some embodiments, STI 436 can include a dielectric material, such as $SiO_x$, deposited by flowable deposition methods. In some embodiments, the formation of FET 102 can be followed by bonding semiconductor device 100 to a carrier substrate (not shown) on first side 401$s$1 of substrate 401 and flipping the bonded structure upside down, as shown in FIG. 4.

Figure 5:
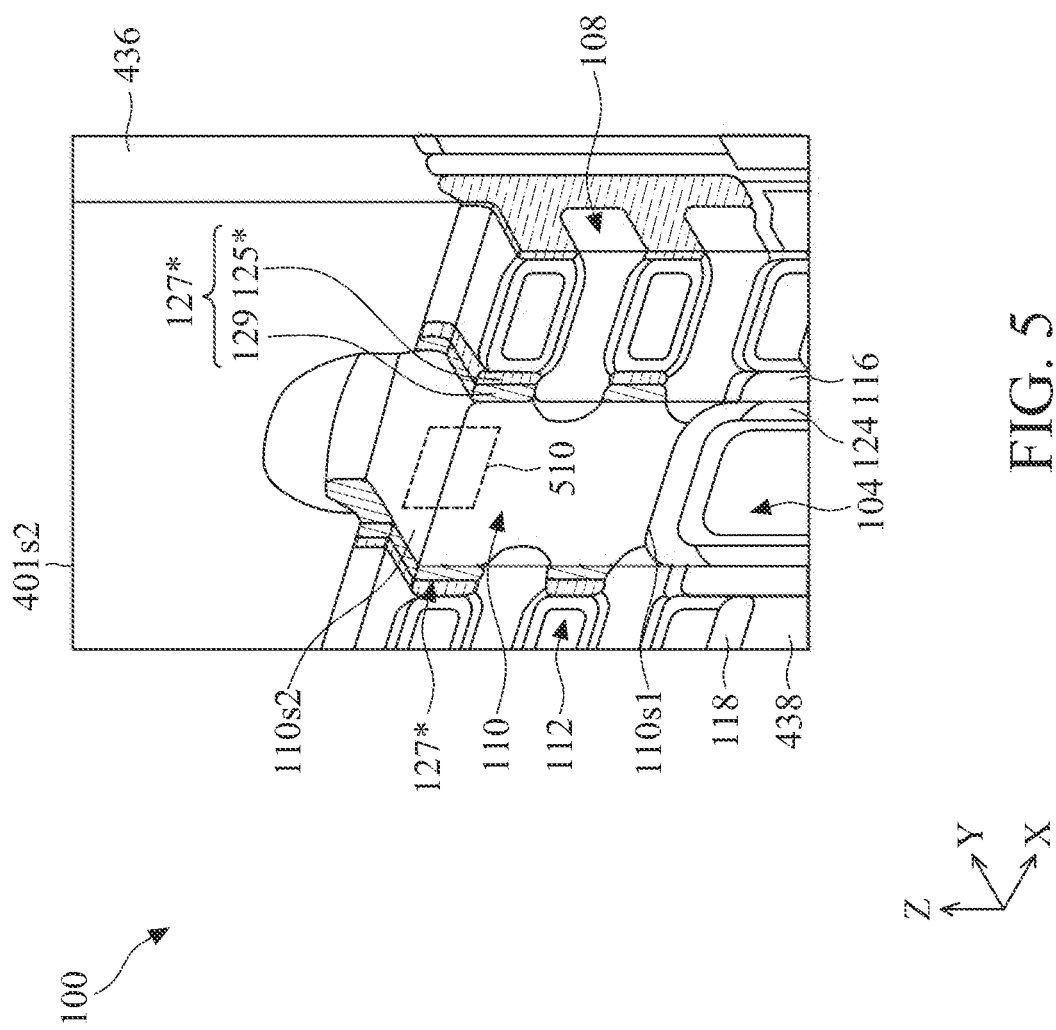

In operation 320 of FIG. 3, a portion of the substrate is removed from a second side of the substrate to expose the epitaxial structure and the inner spacer structure. The second side is opposite to the first side. For example, as shown in FIG. 5, a portion of substrate 401 can be removed from second side 401$s$2 (e.g., backside) of substrate 401 to expose S/D epitaxial structures 110 and inner spacer structures 127*. In some embodiments, the removal of substrate 401 can include a grinding process, a trimming process, a thinning process, a chemical mechanical polishing (CMP) process, and a patterned etching process. After the removal of substrate 401, S/D epitaxial structures 110, inner spacer structures 127*, and gate structures 112 can be exposed for subsequent processes. In some embodiments, second side 110$s$2 of S/D epitaxial structures 110 can be exposed to form an oxide layer.

Figure 6:
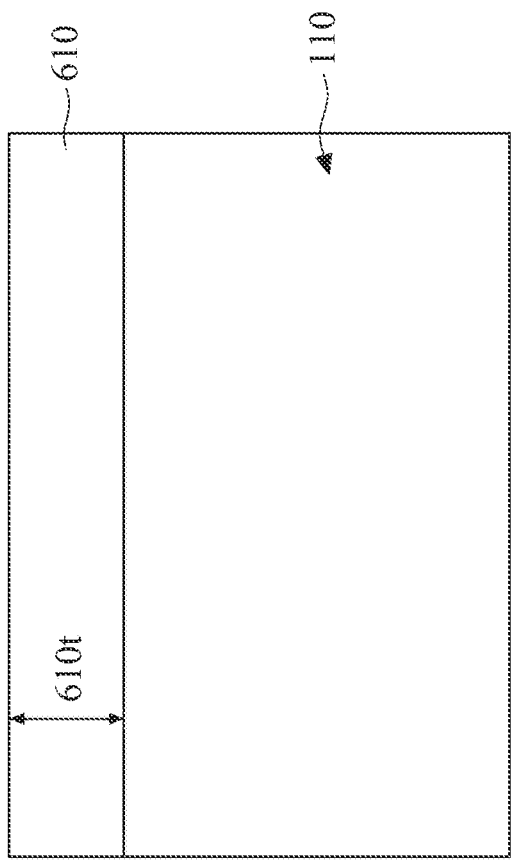
Figure 7:
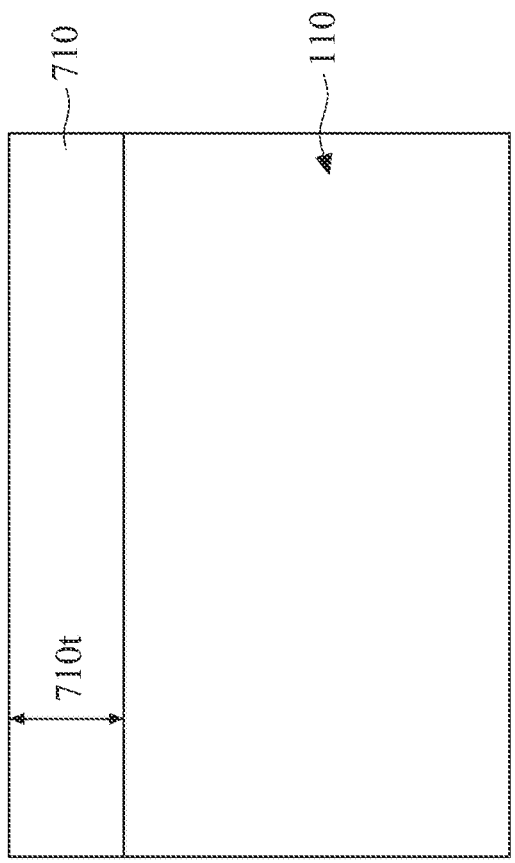

In operation 330 of FIG. 3, an oxide layer can be formed on the epitaxial structure on the second side. For example, as shown in FIGS. 6 and 7, oxide layer 710 can be formed on S/D epitaxial structures 110 on second side 401$s$2 (e.g., backside). In some embodiments, S/D epitaxial structures 110 can include SiGe. The formation of oxide layer 710 can include treating S/D epitaxial structures 110 in a hydrogen plasma followed by treating S/D epitaxial structures 110 in an oxygen plasma. FIGS. 6 and 7 illustrate enlarged cross-sectional views of region 510 in FIG. 5, in accordance with some embodiments.

In some embodiments, the hydrogen plasma treatment can treat S/D epitaxial structures 110 with a plasma of hydrogen and argon for about 20 s to about 40 s. A flow rate of hydrogen can range from about 60 standard cubic centimeters per minute (sccm) to about 80 sccm. Argon can act as a carrier gas for hydrogen and a flow rate of argon can range from about 80 sccm to about 120 sccm. The hydrogen plasma treatment can separate silicon from the SiGe in S/D epitaxial structures 110, as shown in FIG. 6, due to a higher bonding energy of hydrogen to silicon. After the hydrogen treatment, separation layer 610 can be formed on S/D epitaxial structures 110. For example, S/D epitaxial structures 110 can include SiGe with germanium at about 20%. After the hydrogen plasma treatment, separation layer 610 can be formed with germanium at about 1% to about 5%. S/D epitaxial structures 110 adjacent to separation layer 610 can have germanium at about 25% to about 30%. In some embodiments, separation layer 610 can have a thickness 610$t$ from about 2 nm to about 4 nm.

The hydrogen plasma treatment can be followed by the oxygen plasma treatment. In some embodiments, the oxygen plasma treatment can treat separation layer 610 on S/D epitaxial structures 110 with a plasma of oxygen and argon for about 20 s to about 40 s. A flow rate of oxygen can range from about 130 sccm to about 150 sccm. Argon can act as a carrier gas for oxygen and a flow rate of argon can range from about 500 sccm to about 700 sccm. The oxygen plasma treatment can oxidize separation layer 610 and form oxide layer 710 on S/D epitaxial structures 110. In some embodiments, S/D epitaxial structures 110 can include SiGe, separation layer 610 can include silicon, and oxide layer 710 can include $SiO_x$. In some embodiments, an etch selectivity between second spacer layers 125* and SiGe can range from about 10 to about 40. An etch selectivity between second spacer layers 125* and silicon can range from about 60 to about 100. An etch selectivity between second spacer layers 125* and $SiO_x$ can range from about 80 to about 120. $SiO_x$ can be less porous than silicon germanium oxide and can have a higher etch selectivity than silicon germanium oxide. Therefore, oxide layer 710 can protect S/D epitaxial structures 110 and prevent loss of SiGe in S/D epitaxial structures 110 during a subsequent removal of second spacer layers 125*. In some embodiments, oxide layer 710 can have a thickness 710t from about 2 nm to about 4 nm. In some embodiments, S/D epitaxial structures 110 can include silicon. The formation of oxide layer 710 can include treating S/D epitaxial structures 110 in an oxygen plasma.

Figure 8:
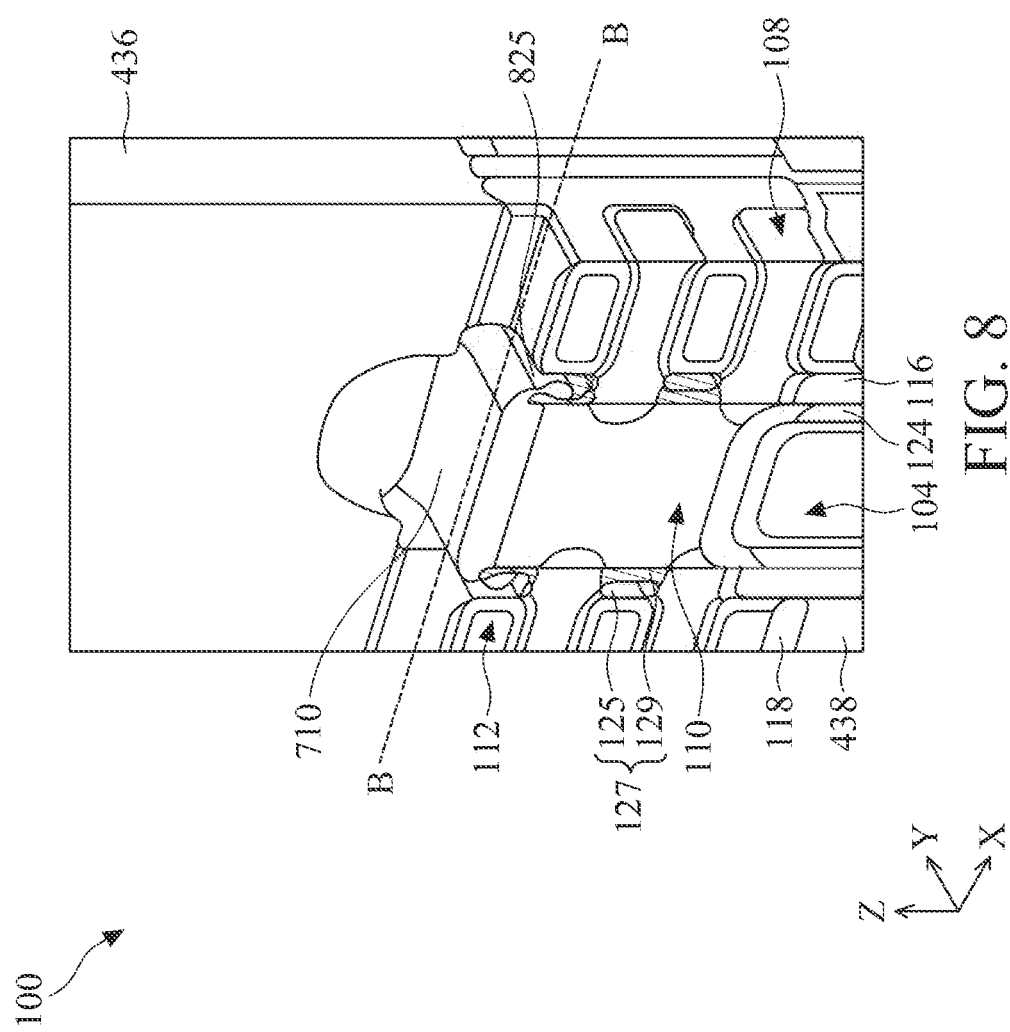
Figure 9:
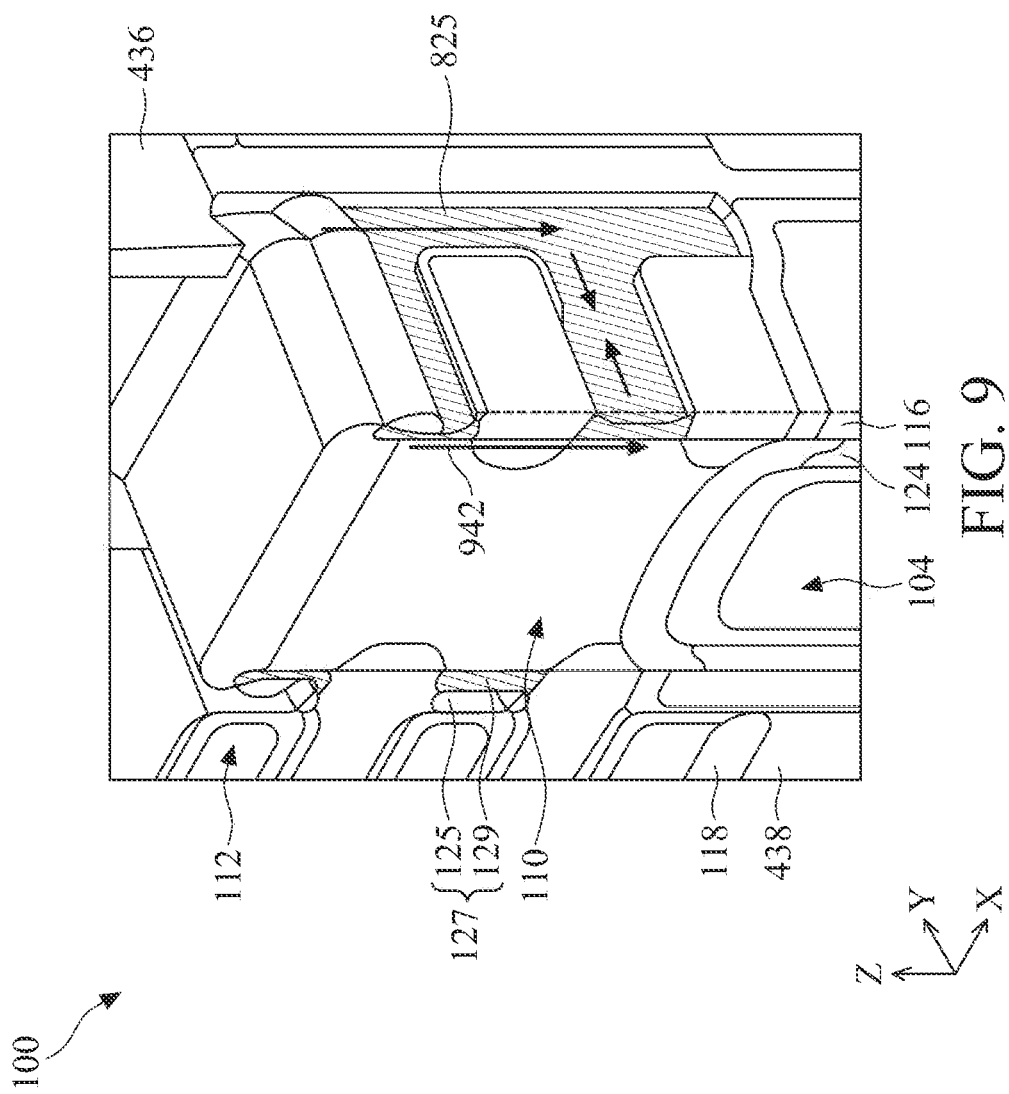
Figure 10:
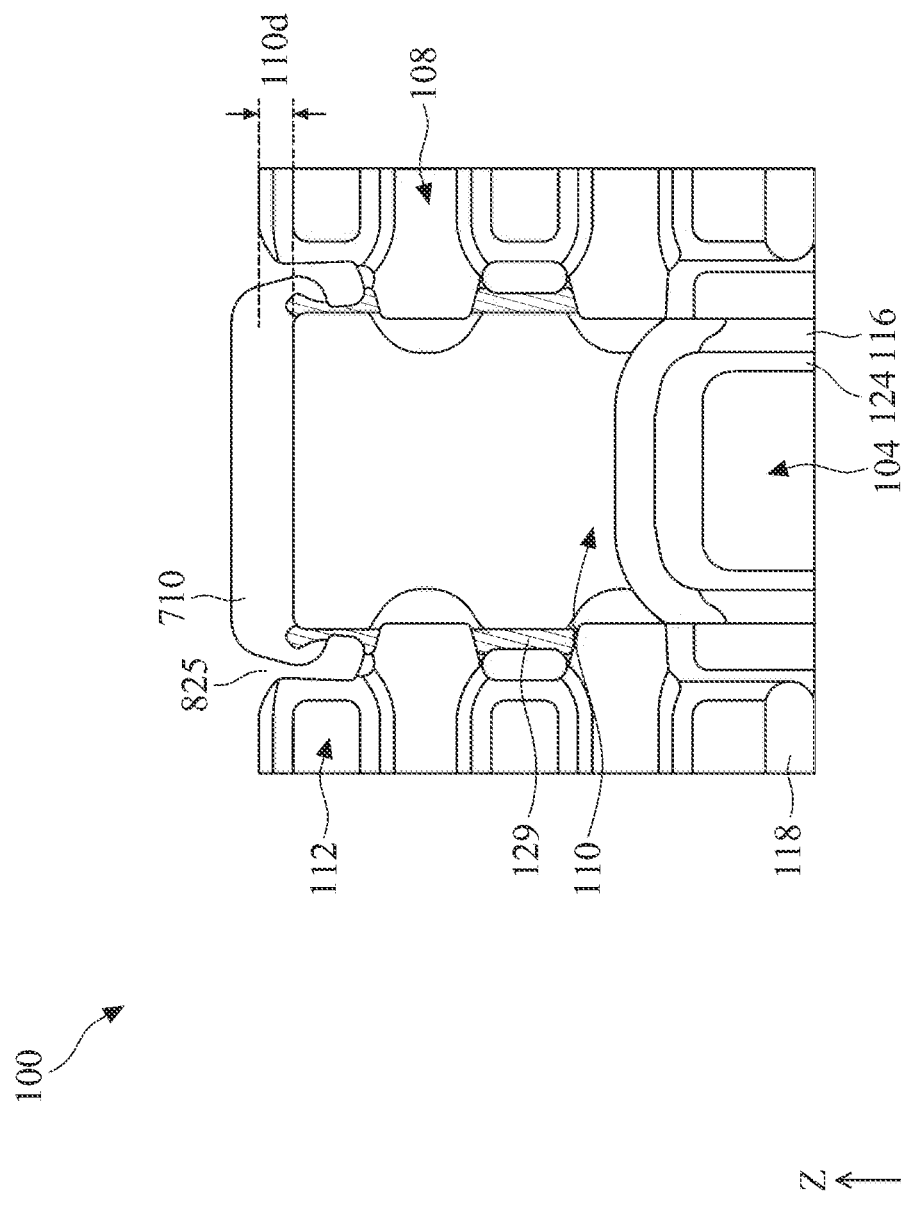

In operation 340 of FIG. 3, a portion of the inner spacer structure is removed to form an opening. For example, as shown in FIGS. 8-10, second spacer layers 125* of inner spacer structures 127* can be removed to form openings 825. FIG. 9 is an enlarged isometric view of openings 825 and inner spacer structures 127 in FIG. 8, in accordance with some embodiments. FIG. 10 is a cross-sectional view of semiconductor device 100 along line B-B in FIG. 8, in accordance with some embodiments. In some embodiments, after the formation of oxide layer 710 on S/D epitaxial structures 110, a distance 110d between top surfaces of S/D epitaxial structures 110 and top surface surfaces of gate structures 112 can range from about 1 nm to about 4 nm, as shown in FIG. 10. A ratio of distance 110d to vertical dimension 129h can range from about 0.1 to about 0.5. If distance 110d is less than about 1 nm or the ratio is less than about 0.1, oxide layer 710 may not protect S/D epitaxial structures 110. If distance 110d is greater than about 4 nm or the ratio is greater than about 0.5, S/D epitaxial structures 110 may be further consumed and the device performance may be degraded.

In some embodiments, the removal of second spacer layers 125* can be performed at a temperature from about 10° C. to about 20° C. under a pressure from about 300 mtorr to about 500 mtorr. In some embodiments, the removal of second spacer layers 125* can include an etching process and an annealing process. In the etching process, the second spacer layers 125* can be etched by a plasma of a fluorine-based etchant such as nitrogen trifluoride ($NF_3$), hydrogen, oxygen, and argon for about 50 s to about 150 s. As shown in FIG. 9, arrows 942 can indicate directions of the plasma during etching of second spacer layers 125*. A flow rate of the fluorine-based etchant can range from about 10 sccm to about 30 sccm. A flow rate of hydrogen can range from about 40 sccm to about 60 sccm. A flow rate of oxygen can range from about 80 sccm to about 120 sccm. Argon can act as a carrier gas for the plasma and a flow rate of argon can range from about 150 sccm to about 250 sccm. In some embodiments, hydrogen and oxygen in the plasma can form an oxide layer on semiconductor layers 120 and protect semiconductor layers 120. In some embodiments, the removal of second spacer layers 125* can form byproducts in openings 825. After the etching process, the annealing process can be performed to bake inner spacer structures 127 at a temperature above about 180° C. for about 1 s to about 10 s to remove byproducts. The byproducts can evaporate at a temperature above about 180° C. and can be removed during the annealing process. In some embodiments, the removal of second spacer layers 125* can include one or more cycles of the etching process and the annealing process. In some embodiments, the number of the cycles of the etching process and the annealing process can range from about 5 to about 15.

Figure 11:
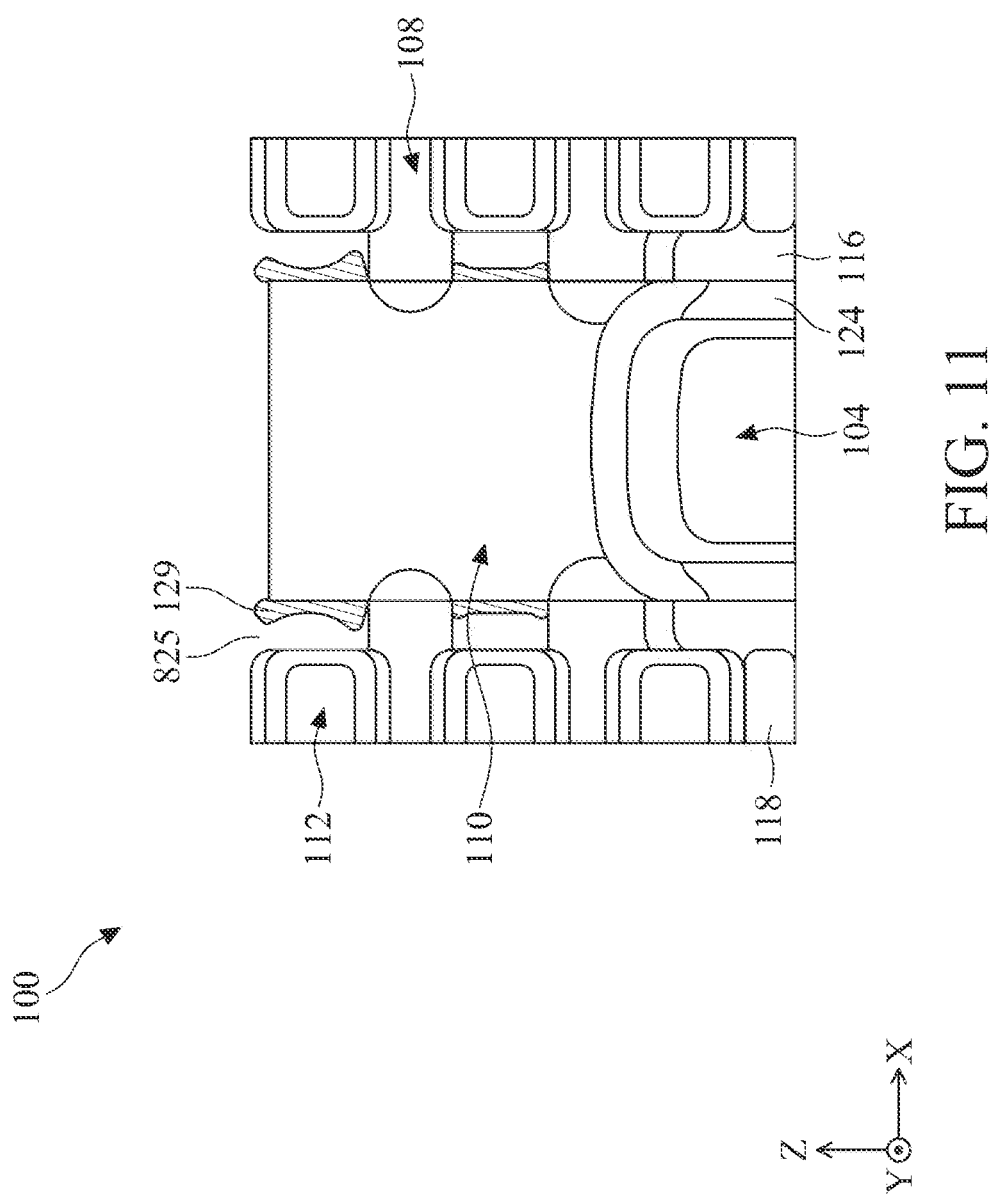

The removal of the portion of inner spacer structures 127* can be followed by the removal of oxide layer 710, as shown in FIG. 11. In some embodiments, oxide layer 710 can be removed by a chemical dry etch process at a temperature from about 30° C. to about 50° C. under a pressure from about 1 torr to about 5 torr. In some embodiments, the chemical dry etch process can include etchants, such as hydrogen fluoride (HF) and ammonia ($NH_3$). The chemical dry etch process can remove oxide layer 710 in about 20 s to about 40 s. After removal of oxide layer 710, second side 110s2 (e.g., backside) of S/D epitaxial structures 110 can be exposed.

Figure 12:
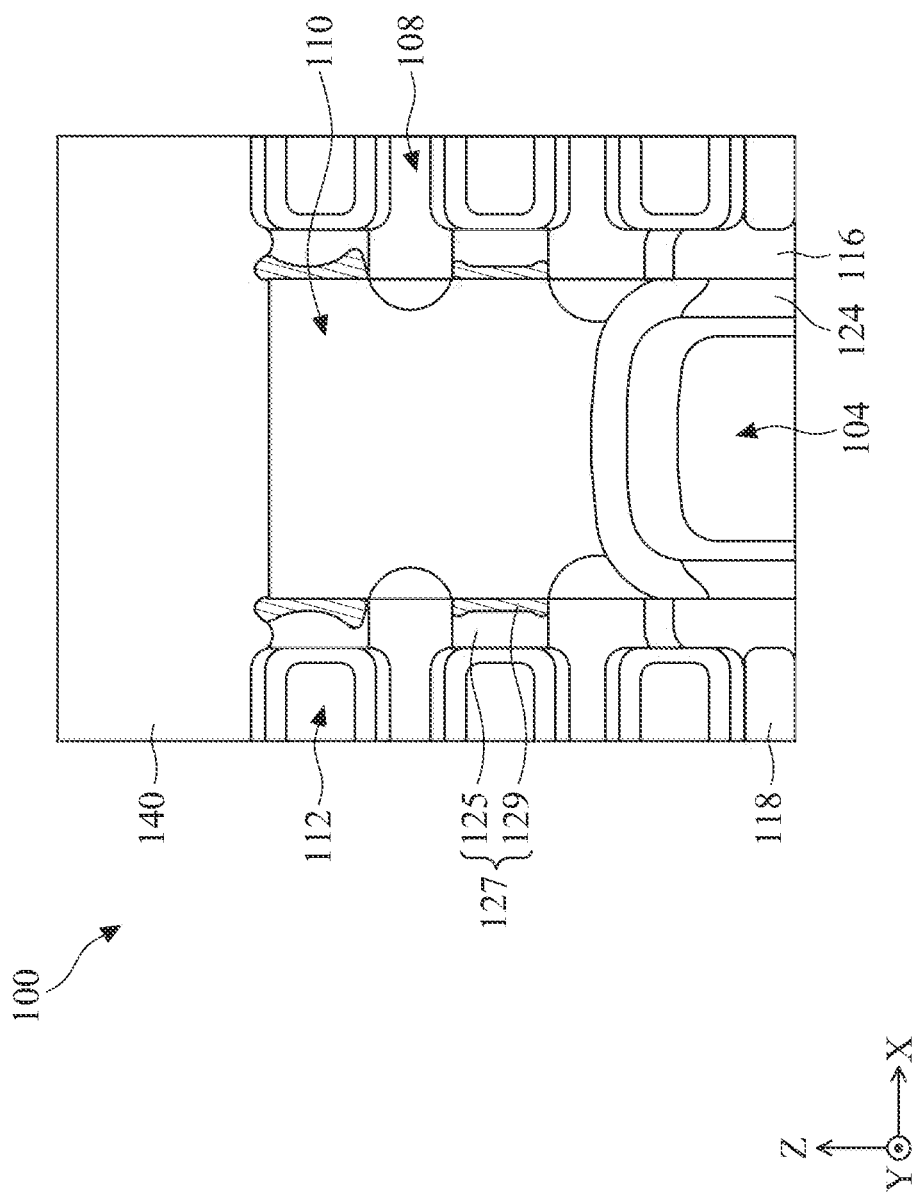

The removal of oxide layer 710 can be followed by the formation of dielectric layer 140, as shown in FIG. 12. Dielectric layer 140 can be deposited on S/D epitaxial structures 110 and gate structures 112 to seal openings 825 and form backside inner air spacers 125. In some embodiments, dielectric layer 140 can be deposited by plasma enhanced chemical vapor deposition (PECVD) or other suitable deposition methods at a temperature from about 300° C. to about 500° C. under a pressure from about 500 mtorr to about 1000 mtorr. Dielectric layer 140 can protect adjacent structures during the formation of backside contact structures 106. In some embodiments, air inner spacers 125 can be filled with air and can have a dielectric constant of about 1 to reduce the dielectric constant and parasitic capacitance between gate structures 112 and S/D epitaxial structures 110. In some embodiments, the parasitic capacitance between gate structures 112 and the S/D epitaxial structures 110 can be reduced by about 5% to about 10% with air inner spacers 125 and the device performance of semiconductor device 100 can be improved by about 5% to about 10%.

The formation of dielectric layer 140 can be followed by the formation of backside contact structures 106, as shown in FIG. 2. Backside contact structures 106 can be formed on second side 110s2 (e.g., backside) of S/D epitaxial structures 110 with a patterning process. In some embodiments, the formation of backside contact structures 106 can include the formation of metal silicide layers 150 and the formation of metal line 148. Backside contact structures 106 can connect S/D epitaxial structures 110 to backside power rails 105, as shown in FIG. 1.

Various embodiments in the present disclosure provide methods for forming a semiconductor device 100 with air inner spacers 125. According to some embodiments, air inner spacers 125 can be formed by removing a portion of inner spacer structures 127 between S/D epitaxial structures 110 and gate structures 112 of semiconductor device 100. Inner spacer structures 127, S/D epitaxial structures 110, and gate structures 112 can be formed on first side 401s1 (e.g., front side) of substrate 401. Inner spacer structures 127* can include first spacer layers 129 and second spacer layers 125* and second spacer layers 125* can have a higher etch selectivity than first spacer layers 129. Semiconductor device 100 can be bonded to a carrier wafer and a portion of substrate 401 can be removed from second side 401$s$2 (e.g., backside) of substrate 401 to expose S/D epitaxial structures 110 and inner spacer structures 127*. Second spacer layers 125* can be removed from second side 410$s$2 (e.g., backside) to form openings 825 in FIG. 8. Dielectric layer 140 can be formed on S/D epitaxial structures 110 to seal openings 825 and form air inner spacers 125, as shown in FIG. 11. As compared to other dielectric materials, air inner spacers 125 can have a lower dielectric constant or k value of about 1. Accordingly, the parasitic capacitance between gate structures 112 and S/D epitaxial structures 110 can be reduced and the device performance of semiconductor device 100 can be improved.

In some embodiments, a method includes forming a semiconductor structure on a first side of a substrate. The semiconductor structure includes a fin structure having multiple semiconductor layers on the substrate, an epitaxial structure on the substrate and in contact with the multiple semiconductor layers, a gate structure wrapped around the multiple semiconductor layers, and an inner spacer structure between the gate structure and the epitaxial structure. The method further includes removing a portion of the substrate from a second side of the substrate to expose the epitaxial structure and the inner spacer structure, forming an oxide layer on the epitaxial structure on the second side of the substrate, and removing a portion of the inner spacer structure to form an opening. The second side is opposite to the first side of the substrate.

In some embodiments, a method includes forming a semiconductor structure. The semiconductor structure includes a fin structure having multiple semiconductor layers, an epitaxial structure in contact with the multiple semiconductor layers, a contact structure on a first side of the epitaxial structure, a gate structure wrapped around the multiple semiconductor layers, and an inner spacer structure between the gate structure and the epitaxial structure. The inner spacer structure includes a first spacer layer in contact with the epitaxial structure and a second spacer layer in contact with the gate structure. The method further includes forming an oxide layer on a second side of the epitaxial structure and removing the second spacer layer to form an opening. The second side is opposite to the first side of the epitaxial structure.

In some embodiments, a semiconductor structure includes a fin structure having multiple semiconductor layers, a gate structure wrapped around the multiple semiconductor layers, an inner spacer structure between the gate structure and the epitaxial structure, a contact structure on a first side of the epitaxial structure, and a dielectric structure on a second side of the epitaxial structure. The inner spacer structure includes an air gap. The second side is opposite to the first side of the epitaxial structure and the dielectric structure seals the air gap.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor structure on a first side of a substrate, wherein the semiconductor structure comprises:
        a fin structure, on the substrate, comprising a plurality of semiconductor layers;
        an epitaxial structure on the substrate and in contact with the plurality of semiconductor layers;
        a gate structure wrapped around the plurality of semiconductor layers; and
        an inner spacer structure between the gate structure and the epitaxial structure;
    removing a portion of the substrate from a second side of the substrate to expose the epitaxial structure and the inner spacer structure, wherein the second side is opposite to the first side of the substrate;
    forming an oxide layer on the epitaxial structure on the second side of the substrate; and
    removing a portion of the inner spacer structure to form an opening.

2. The method of claim 1, wherein the forming the oxide layer comprises:
    treating the epitaxial structure with a hydrogen plasma; and
    treating the epitaxial structure with an oxygen plasma.

3. The method of claim 1, wherein the removing the portion of the inner spacer structure comprises etching the portion of the inner spacer structure adjacent to the gate structure.

4. The method of claim 1, wherein the removing the portion of the inner spacer structure comprises etching the portion of the inner spacer structure with a plasma of a fluorine-based etchant, hydrogen, and oxygen.

5. The method of claim 1, wherein the removing the portion of the inner spacer structure comprises:
    etching the portion of the inner spacer structure; and
    baking the inner spacer structure.

6. The method of claim 1, further comprising removing the oxide layer.

7. The method of claim 1, further comprising forming a dielectric layer on the second side of the substrate to seal the opening.

8. The method of claim 7, further comprising forming, on the second side of the substrate, a contact structure on the epitaxial structure surrounded by the dielectric layer.

9. A method, comprising:
    forming a semiconductor structure, wherein the semiconductor structure comprises:
        a fin structure comprising a plurality of semiconductor layers;
        an epitaxial structure in contact with the plurality of semiconductor layers;
        a contact structure on a first side of the epitaxial structure;
        a gate structure wrapped around the plurality of semiconductor layers; and an inner spacer structure, between the gate structure and the epitaxial structure, comprising a first spacer layer in contact with the epitaxial structure and a second spacer layer in contact with the gate structure;

forming an oxide layer on a second side of the epitaxial structure, wherein the second side is opposite to the first side of the epitaxial structure; and removing the second spacer layer to form an opening.

10. The method of claim 9, wherein the forming the oxide layer comprises:

treating the epitaxial structure with a hydrogen plasma; and treating the epitaxial structure with an oxygen plasma.

11. The method of claim 9, wherein the removing the second spacer layer comprises etching the second spacer layer with a plasma of a fluorine-based gas, hydrogen, and oxygen.

12. The method of claim 9, wherein the removing the second spacer layer comprises:

etching the second spacer layer; and baking the inner spacer structure.

13. The method of claim 9, further comprising removing the oxide layer.

14. The method of claim 9, further comprising forming a dielectric layer on the second side of the epitaxial structure to seal the opening.

15. The method of claim 9, further comprising forming, on the second side of the epitaxial structure, an additional contact structure on the epitaxial structure.

16. A method, comprising:

forming a semiconductor device on a first side of a substrate, wherein the semiconductor device comprises:

a stack of semiconductor layers;

an epitaxial structure in contact with the stack of semiconductor layers;

a gate structure wrapped around the stack of semiconductor layers; and an inner spacer structure between the gate structure and the epitaxial structure, wherein the inner spacer structure comprises a first spacer layer in contact with the epitaxial structure and a second spacer layer in contact with the gate structure;

removing a portion of the substrate from a second side of the substrate to expose the epitaxial structure and the inner spacer structure, wherein the second side is opposite to the first side of the substrate; and removing the second spacer layer to form an opening.

17. The method of claim 16, further comprising:

treating the exposed epitaxial structure with a hydrogen plasma; and treating the exposed epitaxial structure with an oxygen plasma to form an oxide layer.

18. The method of claim 16, wherein the removing the second spacer layer comprises etching the second spacer layer with a plasma of a fluorine-based etchant, hydrogen, and oxygen.

19. The method of claim 17, further comprising:

annealing the inner spacer structure;

removing an oxide layer; and forming a dielectric layer on the second side of the substrate to seal the opening.

20. The method of claim 19, further comprising forming, on the second side of the substrate, a contact structure on the epitaxial structure surrounded by the dielectric layer.

* * * * *